(12) United States Patent
Lee et al.

(10) Patent No.: US 10,854,489 B2
(45) Date of Patent: Dec. 1, 2020

(54) TOWER LIFT

(71) Applicant: SEMES CO., LTD., Cheonan-si (KR)

(72) Inventors: Jung Hun Lee, Yongin-si (KR); Sung Hyun Lee, Anyang-si (KR); In Bae Jang, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 182 days.

(21) Appl. No.: 16/106,602

(22) Filed: Aug. 21, 2018

(65) Prior Publication Data
US 2019/0067067 A1 Feb. 28, 2019

(30) Foreign Application Priority Data
Aug. 23, 2017 (KR) .......................... 10-2017-0106671

(51) Int. Cl.
*B61L 13/00* (2006.01)
*H01L 21/677* (2006.01)
*B60L 13/00* (2006.01)

(52) U.S. Cl.
CPC ........ *H01L 21/67766* (2013.01); *B60L 13/00* (2013.01); *H01L 21/6773* (2013.01); *H01L 21/67709* (2013.01); *H01L 21/67775* (2013.01)

(58) Field of Classification Search
CPC ........ B60L 13/00; B60L 13/006; B60L 13/04; B60L 13/08
See application file for complete search history.

(56) References Cited

U.S. PATENT DOCUMENTS

2003/0112105 A1* 6/2003 Post ........................ B60L 13/04
335/285
2016/0222957 A1* 8/2016 Robison .................. F04B 47/14

* cited by examiner

*Primary Examiner* — Robert J McCarry, Jr.
(74) *Attorney, Agent, or Firm* — Kile Park Reed & Houtteman PLLC

(57) ABSTRACT

A tower lift includes a main frame extending in a vertical direction, a movable frame configured to be movable in the vertical direction along the main frame, a carriage module mounted to the movable frame, a pair of driving rails extending parallel with each other on the main frame and comprising a plurality of first permanent magnets and a plurality of second permanent magnets arranged in the vertical direction, respectively, a driving wheel disposed between the driving rails to be spaced apart from the driving rails and comprising a plurality of third permanent magnets arranged in a circumferential direction, and a driving unit for rotating the driving wheel.

12 Claims, 11 Drawing Sheets

TOWER LIFT

CROSS-REFERENCE TO RELATED APPLICATION

This application claims the priority benefit of Korean Patent Application No. 10-2017-0106671, filed on Aug. 23, 2017, and all the benefits accruing therefrom under 35 U.S.C. § 119, the contents of which are incorporated by reference in their entirety.

BACKGROUND

The present disclosure relates to a tower lift. More specifically, the present disclosure relates to a tower lift for carrying an object in a vertical direction within a multi-story building.

Generally, in a semiconductor or display manufacturing process, a semiconductor wafer or display substrate may be transported in a vertical direction between clean rooms of multiple floors by a tower lift.

The tower lift may include a main frame extending in a vertical direction, a carriage module for transporting objects, and a driving module for moving the carriage module in the vertical direction using a driving belt such as a timing belt. Particularly, guide rails are mounted on the main frame in the vertical direction, and guide rollers are mounted on the carriage module to guide the carriage module in the vertical direction along the guide rails. However, particles may be generated due to friction between the guide rails and the guide rollers, which may reduce the cleanliness of the clean room.

SUMMARY

The present disclosure provides a tower lift capable of reducing particle generation.

In accordance with an aspect of the present disclosure, a tower lift may include a main frame extending in a vertical direction, a movable frame configured to be movable in the vertical direction along the main frame, a carriage module mounted to the movable frame, a pair of driving rails extending parallel with each other on the main frame and comprising a plurality of first permanent magnets and a plurality of second permanent magnets arranged in the vertical direction, respectively, a driving wheel disposed between the driving rails to be spaced apart from the driving rails and comprising a plurality of third permanent magnets arranged in a circumferential direction, and a driving unit for rotating the driving wheel.

In accordance with some exemplary embodiments, at least one of the third permanent magnets may be disposed between the first permanent magnets and the second permanent magnets so that a driving force is generated by a rotational force of the driving wheel and a magnetic force between the first, second and third permanent magnets.

In accordance with some exemplary embodiments, the first and second permanent magnets may be arranged such that N poles and S poles are disposed in the vertical direction and poles of the same polarity face each other in the vertical direction.

In accordance with some exemplary embodiments, the third permanent magnets may be arranged such that N poles and S poles are disposed in the circumferential direction and poles of the same polarity face each other in the circumferential direction.

In accordance with some exemplary embodiments, the driving wheel may further include a plurality of fourth permanent magnets arranged in the circumferential direction. The third and fourth permanent magnets may be disposed on both sides of the driving wheel to face the first and second permanent magnets, respectively.

In accordance with some exemplary embodiments, the third and fourth permanent magnets may be arranged in a Halbach arrangement, respectively.

In accordance with some exemplary embodiments, the first and second permanent magnets may be arranged in a Halbach arrangement, respectively.

In accordance with an aspect of the present disclosure, a tower lift may include a main frame extending in a vertical direction, a movable frame configured to surround the main frame and to be movable in the vertical direction along the main frame, a plurality of levitation units for levitating the movable frame from the main frame, a carriage module mounted to the movable frame, a pair of driving rails extending parallel with each other on the main frame and comprising a plurality of first permanent magnets and a plurality of second permanent magnets arranged in the vertical direction, respectively, a driving wheel disposed between the driving rails to be spaced apart from the driving rails and comprising a plurality of third permanent magnets arranged in a circumferential direction, and a driving unit for rotating the driving wheel.

In accordance with some exemplary embodiments, at least one of the third permanent magnets may be disposed between the first permanent magnets and the second permanent magnets so that a driving force is generated by a rotational force of the driving wheel and a magnetic force between the first, second and third permanent magnets.

In accordance with some exemplary embodiments, the first and second permanent magnets may be arranged such that N poles and S poles are disposed in the vertical direction and poles of the same polarity face each other in the vertical direction.

In accordance with some exemplary embodiments, the third permanent magnets may be arranged such that N poles and S poles are disposed in the circumferential direction and poles of the same polarity face each other in the circumferential direction.

In accordance with some exemplary embodiments, the driving wheel may further include a plurality of fourth permanent magnets arranged in the circumferential direction. The third and fourth permanent magnets may be disposed on both sides of the driving wheel to face the first and second permanent magnets, respectively, and may be arranged in a Halbach arrangement, respectively.

In accordance with some exemplary embodiments, the first and second permanent magnets may be arranged in a Halbach arrangement, respectively.

In accordance with some exemplary embodiments, the driving unit may include a motor for providing a rotational force and a brake for applying a braking force to a rotational shaft of the motor.

In accordance with some exemplary embodiments, the tower lift may further include a power supply cable extending in the vertical direction along a side surface of the main frame, and a pickup unit mounted on the movable frame to receive power from the power supply cable in a non-contact manner and supply the power to the carriage module.

In accordance with some exemplary embodiments, the tower lift may further include a plurality of levitation rails mounted on the main frame and extending in the vertical direction along the main frame. The levitation units may be mounted on the movable frame to face the levitation rails, respectively, and may levitate the movable frame from the main frame using magnetic force.

In accordance with some exemplary embodiments, the main frame may have a front surface, a rear surface, two side surfaces, and chamfered surfaces between the front and rear surfaces and the side surfaces, and the levitation rails may be disposed on the chamfered surfaces, respectively.

In accordance with some exemplary embodiments, two levitation rails may be disposed to be perpendicular to each other on one of the chamfered surfaces.

In accordance with some exemplary embodiments, the tower lift may further include sensors mounted on the movable frame to measure distances between the levitation rails and the levitation units.

In accordance with some exemplary embodiments, the tower lift may further include auxiliary wheels mounted on the movable frame to be spaced apart from the levitation rails by a predetermined distance.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
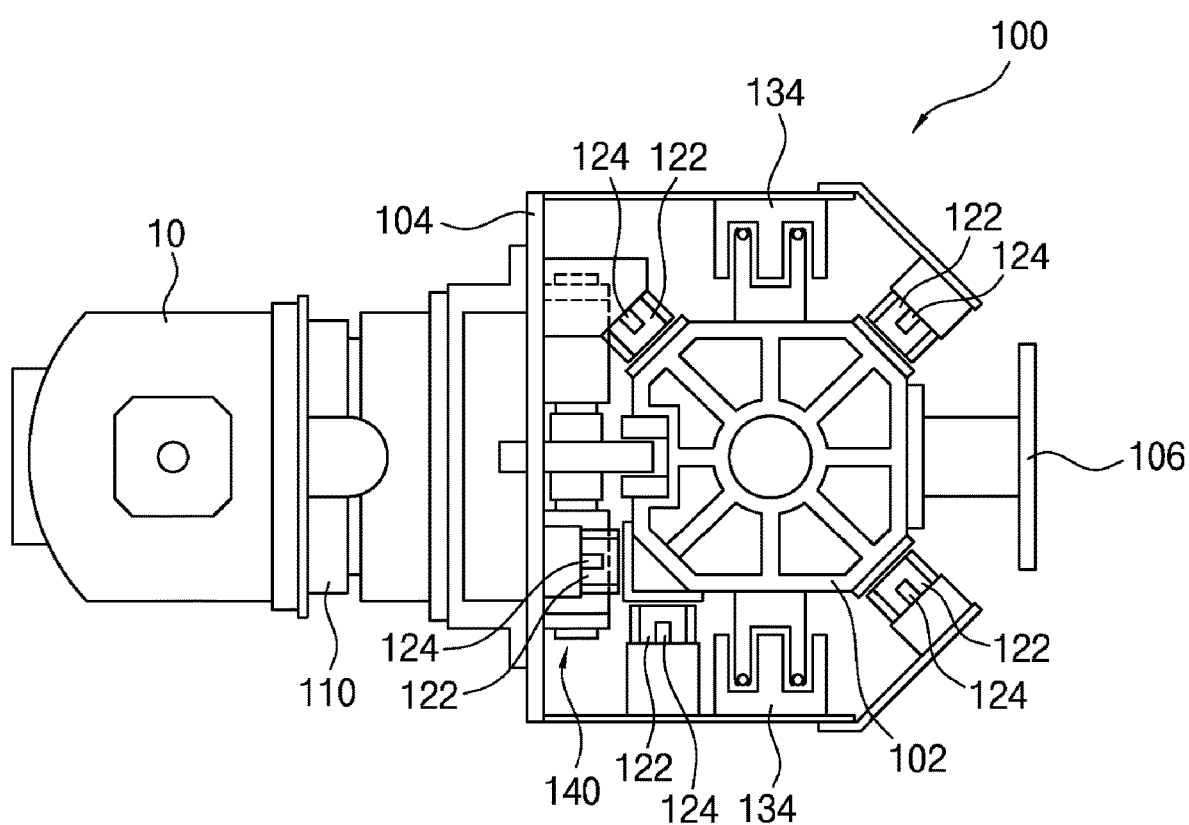
FIG. 1 is a schematic plan view illustrating a tower lift in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
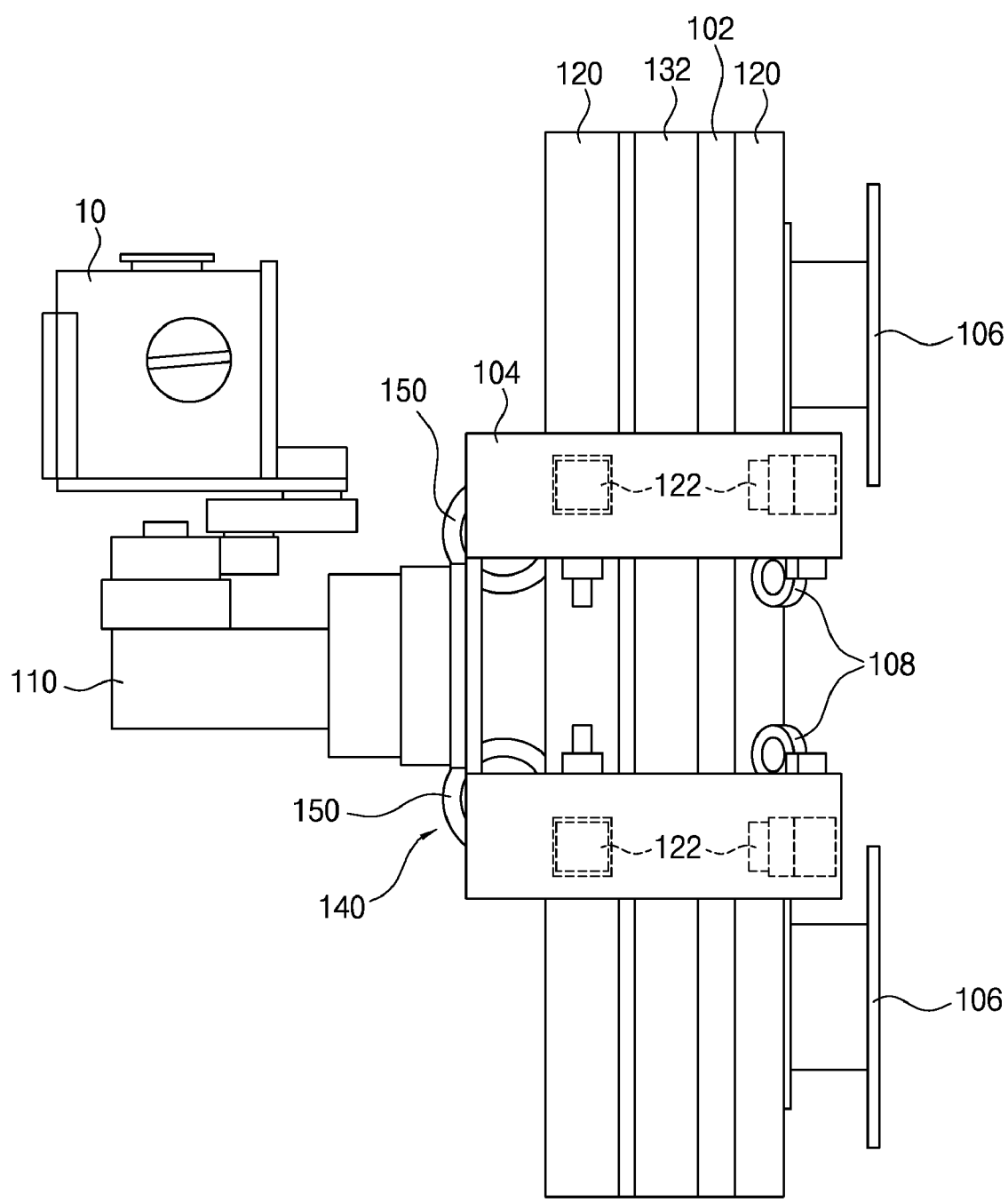
FIG. 2 is a schematic front view illustrating the tower lift as shown in FIG. 1.

FIG. 1 is a schematic plan view illustrating a tower lift in accordance with an exemplary embodiment of the present disclosure, and FIG. 2 is a schematic front view illustrating the tower lift as shown in FIG. 1.

Referring to FIGS. 1 and 2, a tower lift 100, in accordance with an exemplary embodiment of the present disclosure, may be used to transport objects in a vertical direction within a multi-story building. For example, the tower lift 100 may be used to transport a container 10, such as a FOUP (Front Opening Unified Pod) in which semiconductor wafers are received, between clean rooms of multiple floors in a vertical direction.

In accordance with an exemplary embodiment of the present disclosure, the tower lift 100 may include a main frame 102 extending in a vertical direction, a movable frame 104 configured to be movable in the vertical direction along the main frame 102, and a carriage module 110 mounted to the movable frame 104 to transport objects. The carriage module 110 may include a transfer robot for transferring the container 10.

The movable frame 104 may be configured to surround the main frame 102, and may be levitated from the main frame 102 by a plurality of levitation units 122. A plurality of levitation rails 120 (refer to FIG. 3) extending in the vertical direction may be mounted on the main frame 102, and the levitation units 122 may be mounted on the movable frame 104 to face the levitation rails 120, respectively. Particularly, the levitation units 122 may levitate the movable frame 104 from the main frame 102 using magnetic force.

Figure 3:
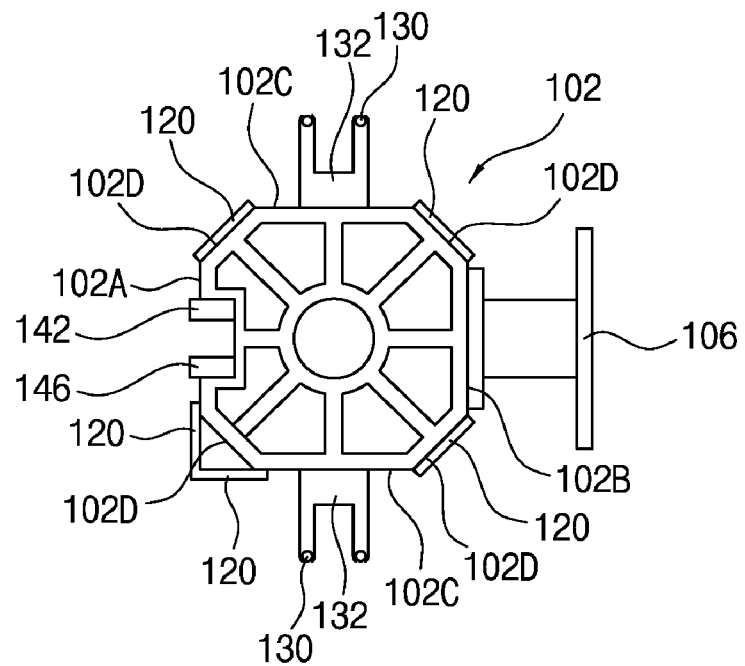
FIG. 3 is a schematic plan view illustrating the main frame as shown in FIG. 1.

FIG. 3 is a schematic plan view illustrating the main frame as shown in FIG. 1.

Referring to FIG. 3, the main frame 102 may have an approximately octagonal cross-sectional structure. For example, the main frame 102 may have a front surface 102A, a rear surface 102B, two side surfaces 102C, and chamfered surfaces 102D between the front and rear surfaces and the side surfaces. The carriage module 110 may be disposed in front of the main frame 102, and mounting brackets 106 for mounting the main frame 102 on a side wall of the clean room may be disposed on the rear surface 102B of the main frame 102.

The movable frame 104 may be configured to surround the remaining surfaces 102A, 102C and 102D except the rear surface 102B of the main frame 102, and the levitation rails 120 may be disposed on the chamfered surfaces 102D. Particularly, two levitation rails 120 may be disposed to be perpendicular to each other on one of the chamfered surfaces 102D so as to prevent yaw movement of the movable frame 104 and the carriage module 110. Further, as shown in FIG. 2, the levitation units 122 may be mounted on upper and lower portions of the movable frame 104, respectively, so as to prevent roll and pitch movements of the movable frame 104 and the carriage module 110. For example, the tower lift 100 may include five levitation rails 120 and ten levitation units 122 as shown in figures.

The tower lift 100 may include sensors 124 mounted on the movable frame 104 to measure distances between the levitation rails 120 and the levitation units 122. For example, each of the levitation units 122 may include an electromagnet for generating electromagnetic force, and the tower lift 100 may include a controller (not shown) for controlling power applied to the levitation units 122 based on the distances measured by the sensors 124.

The tower lift 100 may include auxiliary wheels 108 mounted on the movable frame 104. The auxiliary wheels 108 may be mounted on the movable frame 104 so as to be adjacent to the levitation units 122, respectively. Particularly, the auxiliary wheels 108 may be used to prevent the levitation units 122 from being brought into contact with the levitation rails 120 and may be spaced apart from the levitation rails 120 by a predetermined distance.

The tower lift 100 may include a power supply cable 130 extending in the vertical direction along the side surface 102C of the main frame 102, and a pickup unit 134 (refer to FIG. 1) mounted on the movable frame 104 to receive power from the power supply cable 130 in a non-contact manner and supply the power to the carriage module 110 and the levitation units 122.

For example, cable brackets 132 may be mounted on the side surfaces 102C of the main frame 102 in order to support power supply cables 130, and pickup units 134 surrounding the power supply cables 130 may be mounted on the movable frame 104. For example, the pickup units 134 may be mounted on upper and lower portions of the movable frame 104, respectively. That is, four pick-up units 134 may be mounted on the movable frame 104 as shown in figures.

In accordance with an exemplary embodiment of the present disclosure, the tower lift 100 may include a driving module 140 for moving the movable frame 104 and the carriage module 110 in a non-contact manner.

Figure 4:
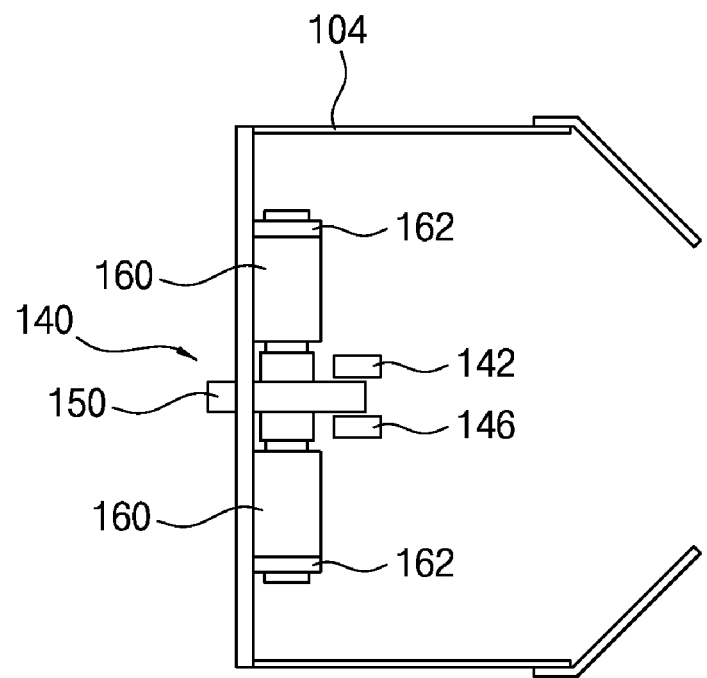
FIG. 4 is a schematic plan view illustrating the driving module as shown in FIG. 1.
Figure 5:
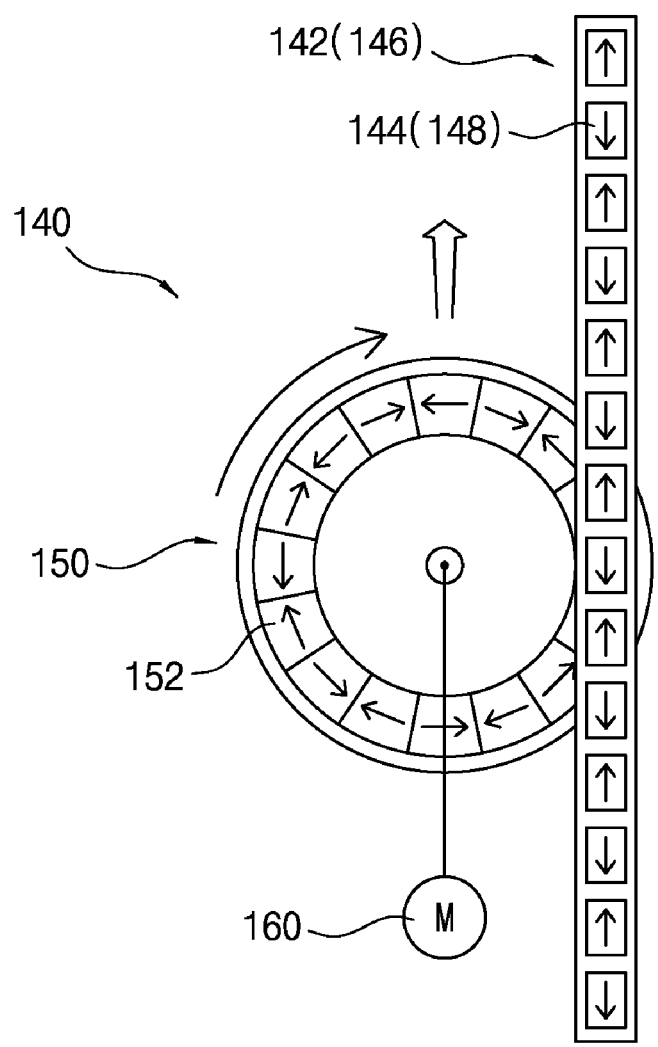
FIG. 5 is a schematic view illustrating driving rails and a driving wheel of the driving module as shown in FIG. 1.
Figure 6:
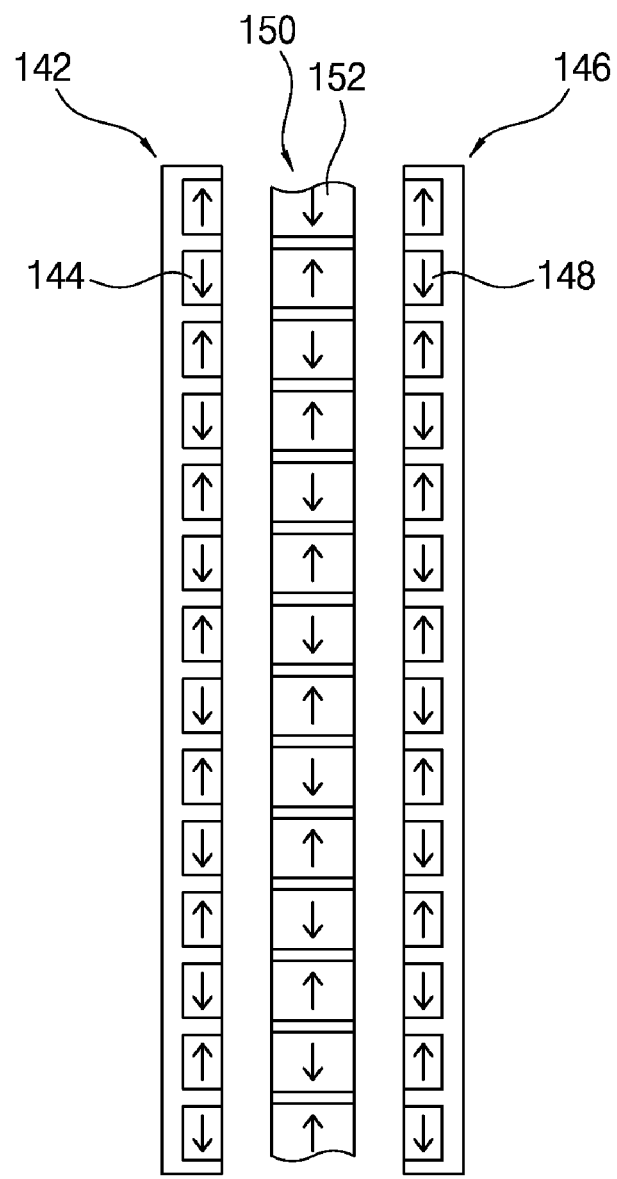
FIG. 6 is a development view illustrating the driving rails and the driving wheel as shown in FIG. 5.

FIG. 4 is a schematic plan view illustrating the driving module as shown in FIG. 1, FIG. 5 is a schematic view illustrating driving rails and a driving wheel of the driving module as shown in FIG. 1, and FIG. 6 is a development view illustrating the driving rails and the driving wheel as shown in FIG. 5.

Referring to FIGS. 4 to 6, the driving module 140 may include a pair of driving rails 142 and 146 extending parallel with each other on the front surface 102A of the main frame 102 and including a plurality of first permanent magnets 144 and a plurality of second permanent magnets 148 arranged in the vertical direction, respectively, a driving wheel 150 disposed between the driving rails 142 and 146 to be spaced apart from the driving rails 142 and 146 and including a plurality of third permanent magnets 152 arranged in a circumferential direction, and a driving unit 160 for rotating the driving wheel 150. Particularly, at least one of the third permanent magnets 152 may be disposed between the first permanent magnets 144 and the second permanent magnets 148 so that a driving force is generated by a rotational force of the driving wheel 150 and a magnetic force between the first, second and third permanent magnets 144, 148 and 152.

For example, the driving module 140 may include two driving wheels 150 arranged vertically and two driving units 160 connected with the driving wheels 150, respectively, as shown in figures.

Further, each of the driving units 160 may include a motor for providing a rotational force, and further the driving module 140 may include brakes 162 for applying a braking force to rotational shafts of the motors of the driving units 160. For example, electromagnetic brakes may be used as the brakes 162, and may apply the braking force to the rotational shafts of the motors to maintain the carriage module 110 in a stopped state.

Particularly, the electromagnetic brake may include a coil for generating an electromagnetic force and a spring for applying the braking force to the rotational shaft, and may release a braking state of the tower lift 100 using the electromagnetic force. Thus, when the power supply to the tower lift 100 is cut off due to a fire or an unexpected cause, the braking state may be maintained by the spring so that the tower lift 100 may be prevented from falling.

The first and second permanent magnets 144 and 148 may be arranged such that N poles and S poles are disposed in the vertical direction and magnetic poles of the same polarity face each other in the vertical direction as shown in FIGS. 5 and 6. For example, first and second permanent magnets 144 and 148 having a cylindrical shape may be mounted to the first and second driving rails 142 and 146, respectively.

The third permanent magnets may be arranged such that N poles and S poles are disposed in the circumferential direction and magnetic poles of the same polarity face each other in the circumferential direction. Particularly, as shown in FIG. 6, pitches of the first and second permanent magnets 144 and 148 may be the same as a pitch of the third permanent magnets 152 in order to increase the magnetic force between the first and third permanent magnets 144 and 152 and between the second and third permanent magnets 148 and 152, and to facilitate the position control of the carriage module 110.

Figure 7:
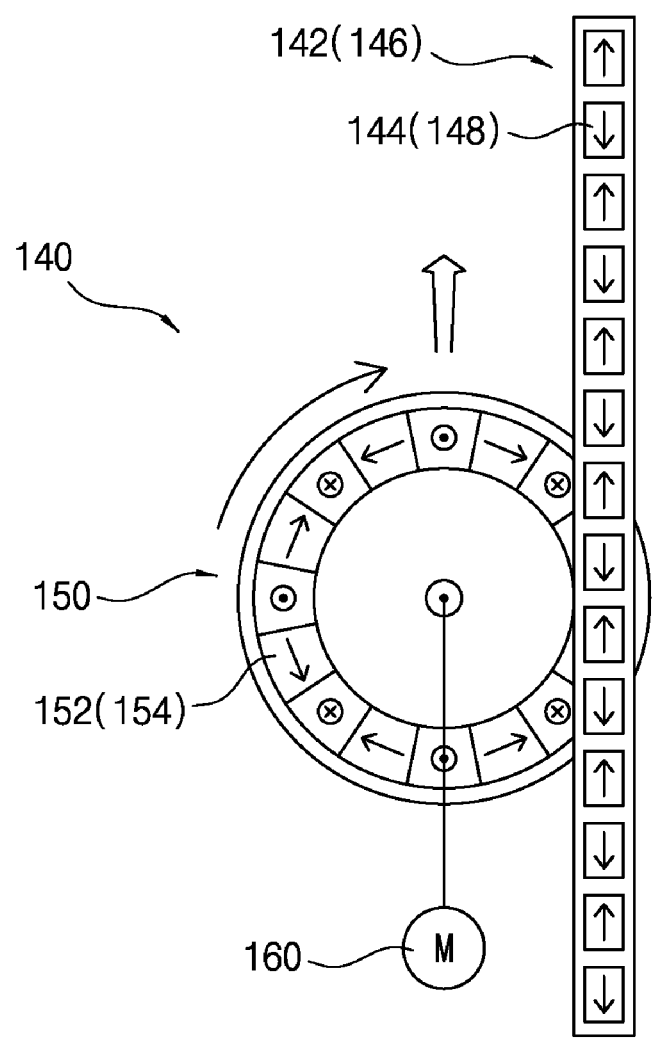
FIG. 7 is a schematic view illustrating another example of the driving module as shown in FIG. 1.
Figure 8:
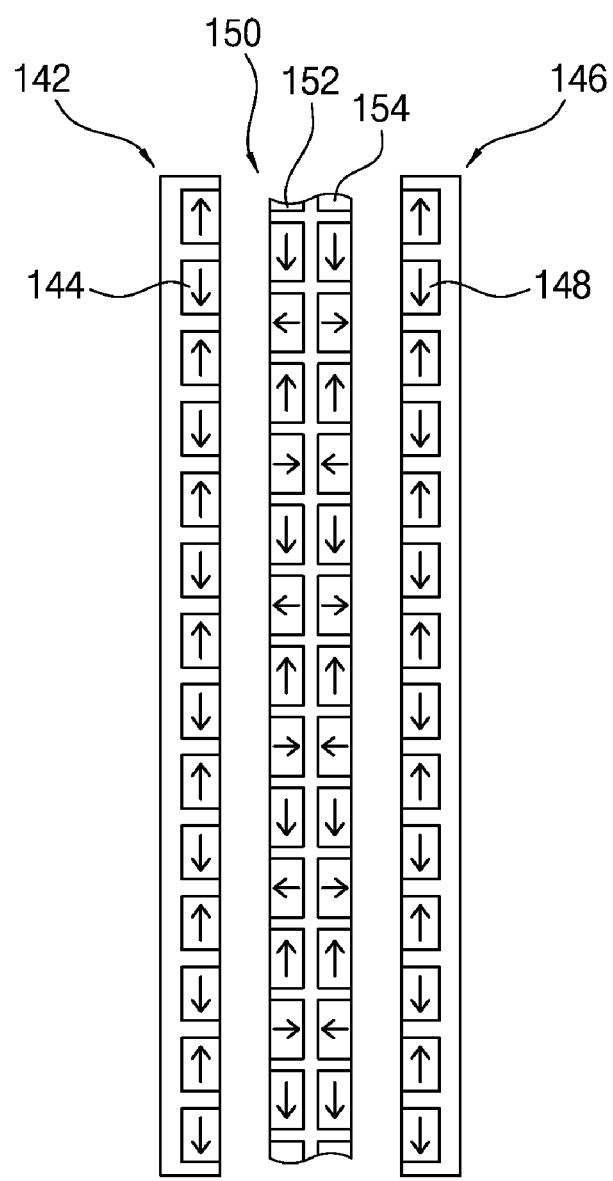
FIG. 8 is a development view illustrating the driving rails and the driving wheel as shown in FIG. 7.

FIG. 7 is a schematic view illustrating another example of the driving module as shown in FIG. 1, and FIG. 8 is a development view illustrating the driving rails and the driving wheel as shown in FIG. 7.

Referring to FIGS. 7 and 8, the driving wheel 150 may include third permanent magnets 152 and fourth permanent magnets 154 arranged in a circumferential direction. The third and fourth permanent magnets 152 and 154 may be disposed on both sides of the driving wheel 150 to face the first and second permanent magnets 144 and 148, respectively.

Particularly, the third and fourth permanent magnets 152 and 154 may be arranged in a Halbach arrangement, respectively. More specifically, the intensity of the magnetic field may be increased by the Halbach arrangement between the first and third permanent magnets 144 and 152 and between the second and fourth permanent magnets 148 and 154, and the driving force of the tower lift 100 may thus be improved. At this time, the first and second permanent magnets 144 and 148 of the driving rails 142 and 146 may be arranged such that N poles and S poles are disposed in the vertical direction and poles of the same polarity face each other in the vertical direction.

Figure 9:
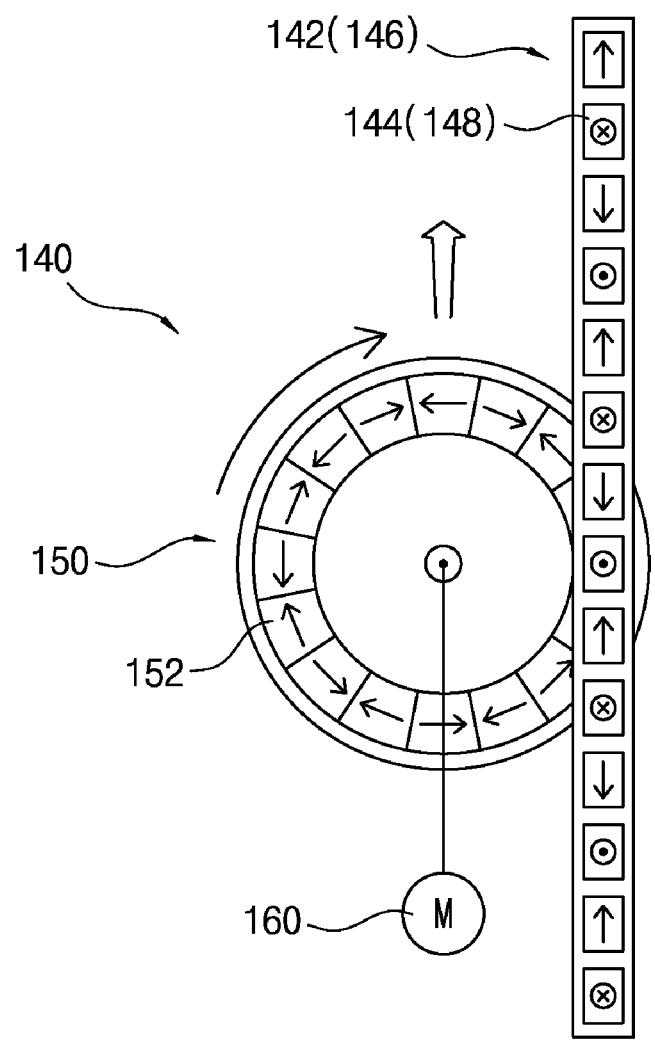
FIG. 9 is a schematic view illustrating still another example of the driving module as shown in FIG. 1.
Figure 10:
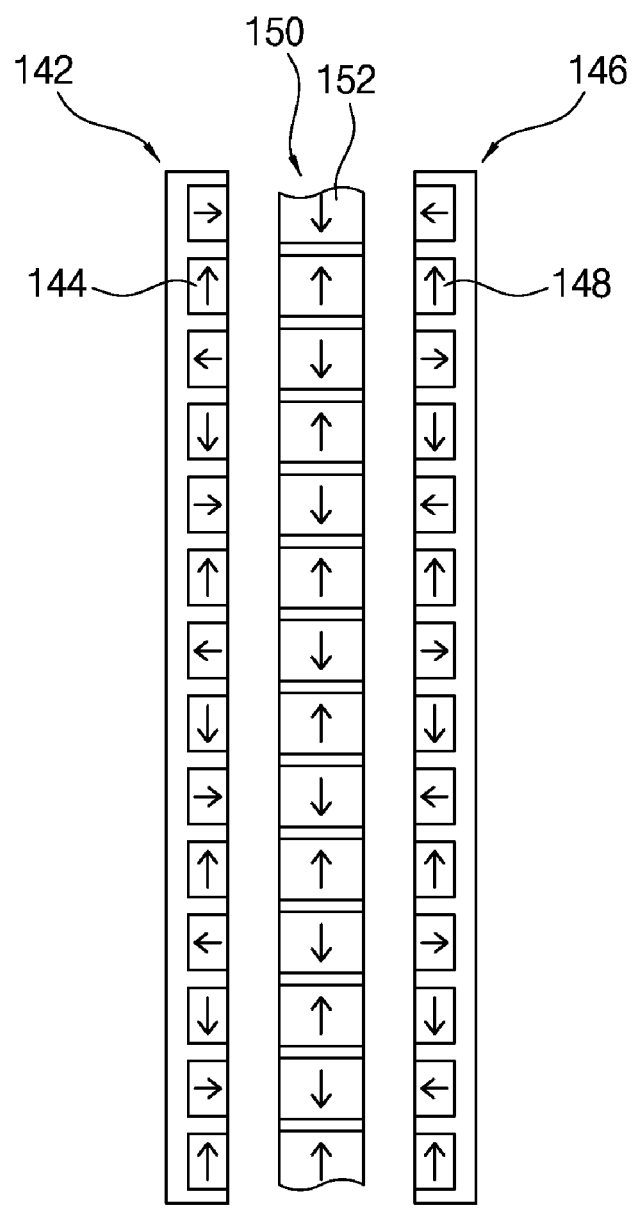
FIG. 10 is a development view illustrating the driving rails and the driving wheel as shown in FIG. 9.

FIG. 9 is a schematic view illustrating still another example of the driving module as shown in FIG. 1, and FIG. 10 is a development view illustrating the driving rails and the driving wheel as shown in FIG. 9.

Referring to FIGS. 9 and 10, first and second permanent magnets 144 and 148 may be arranged in a Halbach arrangement in order to increase the intensity of the magnetic field between the first and third permanent magnets 144 and 152 and between the second and third permanent magnets 148 and 152. At this time, the third permanent magnets 152 may be arranged such that N poles and S poles are disposed in the circumferential direction and poles of the same polarity face each other in the circumferential direction.

Figure 11:
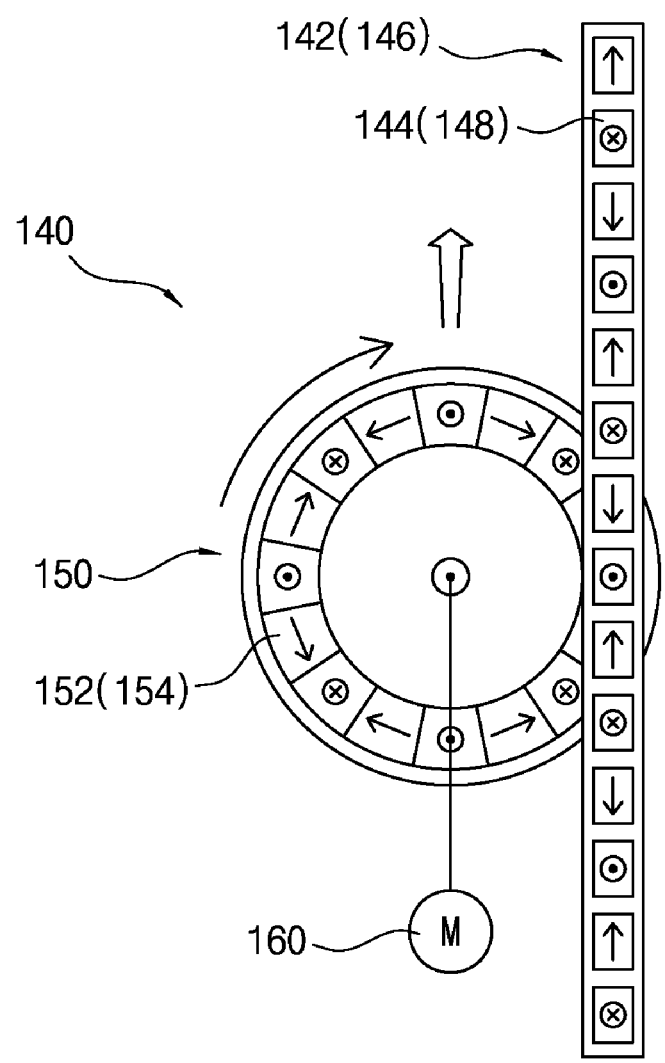
FIG. 11 is a schematic view illustrating still another example of the driving module as shown in FIG. 1.
Figure 12:
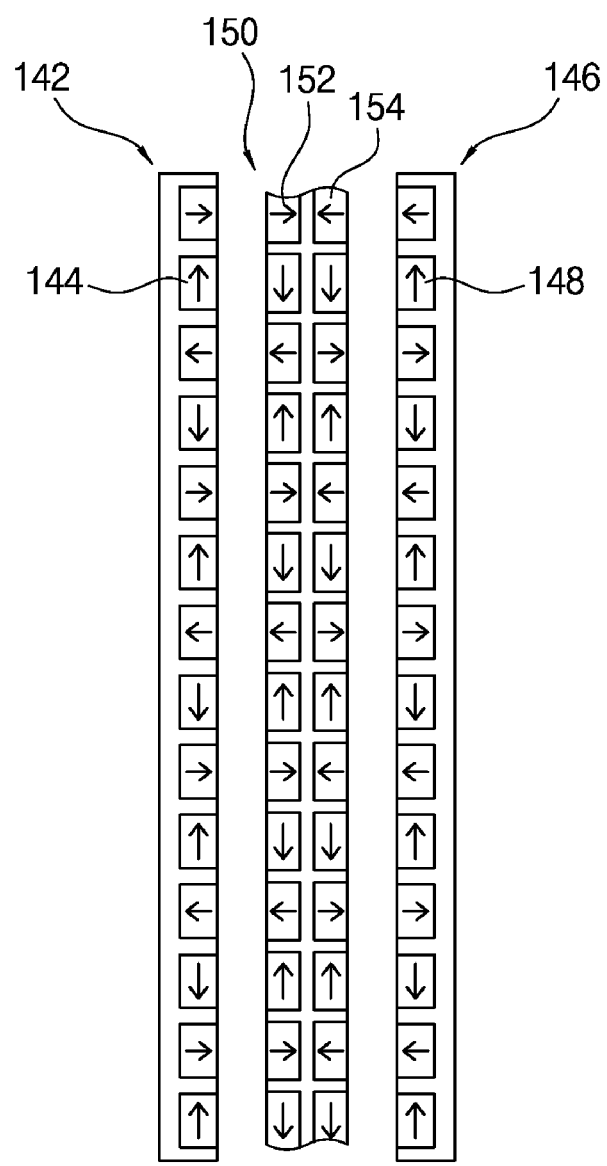
FIG. 12 is a development view illustrating the driving rails and the driving wheel as shown in FIG. 11.

FIG. 11 is a schematic view illustrating still another example of the driving module as shown in FIG. 1, and FIG. 12 is a development view illustrating the driving rails and the driving wheel as shown in FIG. 11.

Referring to FIGS. 11 and 12, the driving wheel 150 may include third permanent magnets 152 and fourth permanent magnets 154 arranged in a circumferential direction. The third and fourth permanent magnets 152 and 154 may be disposed on both sides of the driving wheel 150 to face the first and second permanent magnets 144 and 148, respectively.

Particularly, the first and second permanent magnets 144 and 148 and the third and fourth permanent magnets 152 and 154 may be arranged in a Halbach arrangement in order to increase the intensity of the magnetic field between the first and third permanent magnets 144 and 152 and between the second and fourth permanent magnets 148 and 154.

In accordance with the exemplary embodiments of the present disclosure as described above, a tower lift 100 may include a main frame 102 extending in a vertical direction, a movable frame 104 configured to surround the main frame 102 and to be movable in the vertical direction along the main frame 102, a plurality of levitation units 122 for levitating the movable frame 104 from the main frame 102, a carriage module 110 mounted to the movable frame 104, and a driving module 140 for providing a driving force in a non-contact manner.

The driving module 140 may include a pair of driving rails 142 and 146 extending parallel with each other on the main frame 102 and including a plurality of first permanent magnets 144 and a plurality of second permanent magnets 148 arranged in the vertical direction, respectively, a driving wheel 150 disposed between the driving rails 142 and 146 to be spaced apart from the driving rails 142 and 146 and including a plurality of third permanent magnets 152 arranged in a circumferential direction, and a driving unit 160 for rotating the driving wheel.

As described above, the movable frame 104 and the carriage module 110 may be levitated from the main frame 102 by the levitation units 122, and may be vertically moved by the driving force provided from the driving module 140 in the non-contact manner. Thus, the particle generation amount may be significantly reduced as compared with the conventional tower lift using the guide rollers and the guide rails, and the cleanliness in the clean rooms using the tower lift 100 may be significantly improved.

Although the tower lift 100 has been described with reference to specific embodiments, it is not limited thereto. Therefore, it will be readily understood by those skilled in the art that various modifications and changes can be made thereto without departing from the spirit and scope of the present disclosure defined by the appended claims.

The invention claimed is:

1. A tower lift comprising:
   a main frame extending in a vertical direction;
   a movable frame configured to surround the main frame and to be movable in the vertical direction along the main frame;
   a plurality of levitation units for levitating the movable frame from the main frame;
   a carriage module mounted to the movable frame;
   a pair of driving rails extending parallel with each other on the main frame and comprising a plurality of first permanent magnets and a plurality of second permanent magnets arranged in the vertical direction, respectively;
   a driving wheel disposed between the driving rails to be spaced apart from the driving rails and comprising a plurality of third permanent magnets arranged in a circumferential direction; and
   a driving unit comprising a motor for providing a rotational force to rotate the driving wheel and a brake for applying a braking force to a rotational shaft of the motor.

2. The tower lift of claim 1, wherein at least one of the third permanent magnets is disposed between the first permanent magnets and the second permanent magnets so that a driving force is generated by a rotational force of the driving wheel and a magnetic force between the first, second and third permanent magnets.

3. The tower lift of claim 1, wherein the first and second permanent magnets are arranged such that N poles and S poles are disposed in the vertical direction and poles of the same polarity face each other in the vertical direction.

4. The tower lift of claim 1, wherein the third permanent magnets are arranged such that N poles and S poles are disposed in the circumferential direction and poles of the same polarity face each other in the circumferential direction.

5. The tower lift of claim 1, wherein the driving wheel further comprises a plurality of fourth permanent magnets arranged in the circumferential direction,
   wherein the third and fourth permanent magnets are disposed on both sides of the driving wheel to face the first and second permanent magnets, respectively, and arranged in a Halbach arrangement, respectively.

6. The tower lift of claim 1, wherein the first and second permanent magnets are arranged in a Halbach arrangement, respectively.

7. The tower lift of claim 1, further comprising:
   a power supply cable extending in the vertical direction along a side surface of the main frame; and
   a pickup unit mounted on the movable frame to receive power from the power supply cable in a non-contact manner and supply the power to the carriage module.

8. The tower lift of claim 1, further comprising a plurality of levitation rails mounted on the main frame and extending in the vertical direction along the main frame,
   wherein the levitation units are mounted on the movable frame to face the levitation rails, respectively, and levitate the movable frame from the main frame using magnetic force.

9. The tower lift of claim 8, wherein the main frame has a front surface, a rear surface, two side surfaces, and chamfered surfaces between the front and rear surfaces and the side surfaces, and the levitation rails are disposed on the chamfered surfaces, respectively.

10. The tower lift of claim 9, wherein two levitation rails are disposed to be perpendicular to each other on one of the chamfered surfaces.

11. The tower lift of claim 8, further comprising sensors mounted on the movable frame to measure distances between the levitation rails and the levitation units.

12. The tower lift of claim 8, further comprising auxiliary wheels mounted on the movable frame to be spaced apart from the levitation rails by a predetermined distance.

\* \* \* \* \*